United States Patent [19]

Fathimulla et al.

[11] Patent Number: 5,166,640
[45] Date of Patent: Nov. 24, 1992

[54] TWO DIMENSIONAL DISTRIBUTED AMPLIFIER HAVING MULTIPLE PHASE SHIFTED OUTPUTS

[75] Inventors: Mohammed A. Fathimulla, Ellicott City, Md.; Warren P. Reif, Colorado Springs, Colo.

[73] Assignee: Allied-Signal Inc., Morris Township, Morris County, N.J.

[21] Appl. No.: 738,767

[22] Filed: Aug. 1, 1991

[51] Int. Cl.[5] ............................................. H03F 3/68
[52] U.S. Cl. ..................... 330/295; 330/54; 330/148; 330/277
[58] Field of Search ............. 330/124 R, 148, 54, 330/277, 295

[56] References Cited

U.S. PATENT DOCUMENTS 4,769,618 9/1988 Parish et al. ................. 330/54 X
5,070,304 12/1991 Salib et al. ..................... 330/54

Primary Examiner—James B. Mullins
Attorney, Agent, or Firm—Howard G. Massung; Robert A. Walsh

[57] ABSTRACT

A two dimensional distributed amplifier phase shifter having a distributed reference amplifier circuit generating a reference signal, the reference amplifier circuit having its input connected to one end of a plurality of serially connected microstrip transmission lines. The phase shifter further has a plurality of phase shifted amplifier circuits, one associated with each of the microstrip transmission lines. Each phase shifted amplifier circuit has an input connected to an end of its associated microstrip transmission line which is opposite the reference amplifier circuit and generates an output signal, phase shifted from the reference signal or the output signal of an adjacent phase shifted amplifier by a predetermined phase angle. The phase shifter may be fabricated as a monolithic microwave integrated circuit.

21 Claims, 5 Drawing Sheets

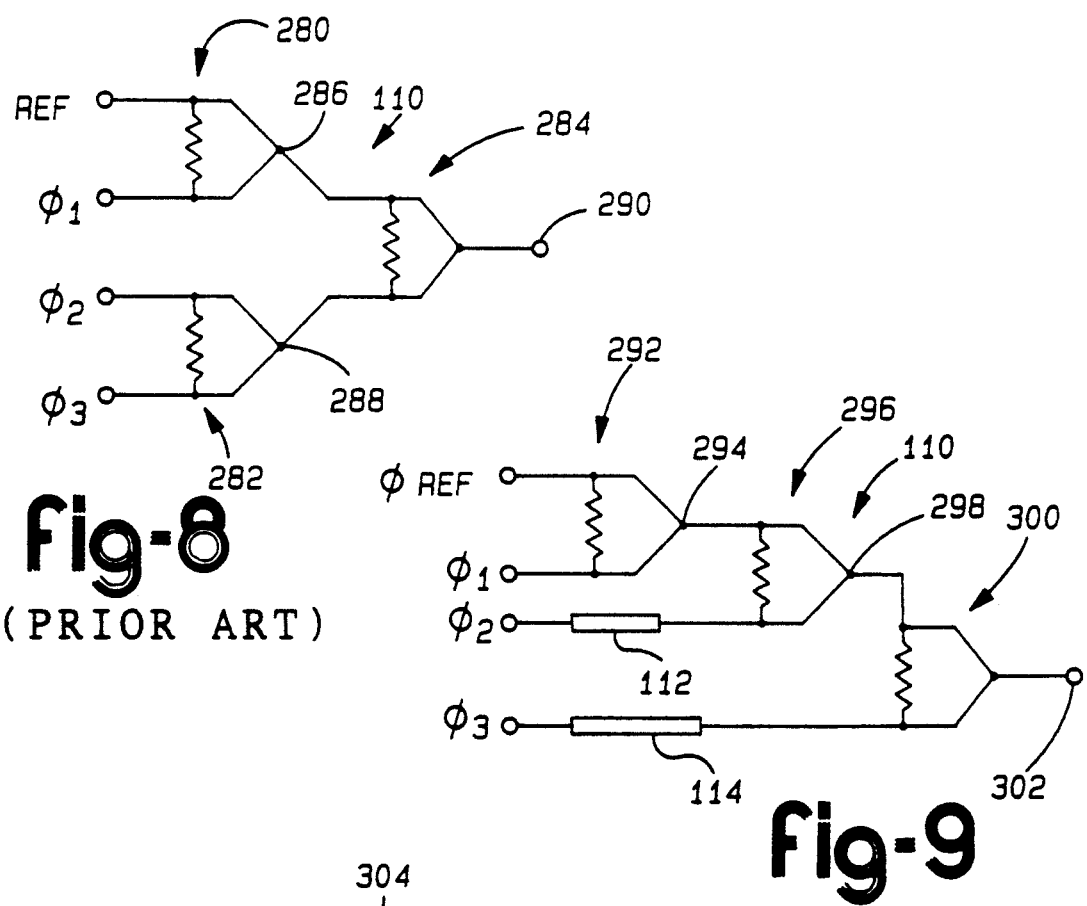
fig-8 (PRIOR ART)
fig-9
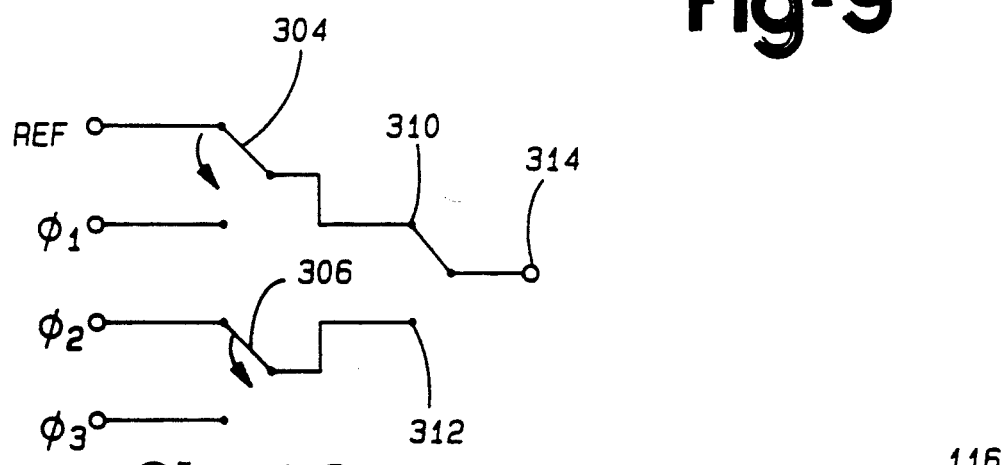
fig-10
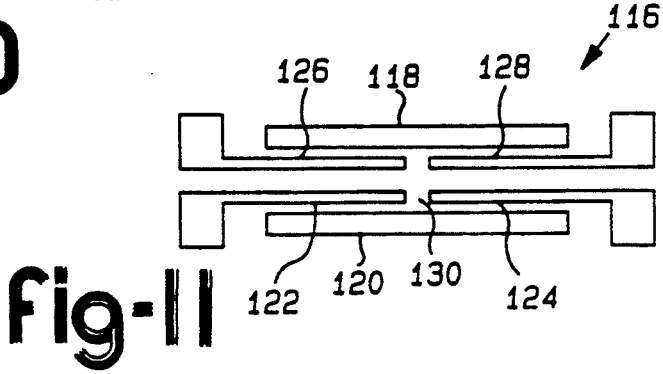
fig-11

TWO DIMENSIONAL DISTRIBUTED AMPLIFIER HAVING MULTIPLE PHASE SHIFTED OUTPUTS

BACKGROUND OF THE INVENTION

I. Field of the Invention

The invention is related to distributed amplifiers and in particular to a two dimensional distributed amplifier having multiple phase shifted outputs.

II. Description of the Prior Art

Distributed amplifiers such as taught by A. C. Beck in U.S. patent are well known in the art. A typical distributed amplifier circuit is shown in FIG. 1. The distributed amplifier circuit has an input terminal 10 which is coupled to a plurality of serially connected microstrip transmission lines 14 through 20 by a capacitor 12. The other end of the serially connected transmission lines is connected to a voltage source $V_g$ through a resistance 22 and to ground through capacitance 24. A plurality of amplifiers 26, 36, 42, and 48 are orthogonally connected to the serially connected microstrip transmission lines. Each amplifier has an input connected to a junction between two adjacent microstrip transmission lines. The output of each amplifier is connected to a second plurality of serially connected microstrip transmission lines 30, 32, 40, 46 and 52 by means of a connecting microstrip transmission line, such as connecting microstrip transmission lines 28, 38, 44 and 50 as shown. One end of the second set of serially connected microstrip transmission lines is connected to a voltage source $V_D$ through a low pass filter 34 and the other end is connected to an output terminal 54.

As is known in the art, the microstrip transmission lines will act as an inductance for high frequency signals, which will phase shift the RF signal received at the input terminal 10. Therefore, for the outputs of the distributed amplifiers 26, 36, 42 and 48 to additively combine it is necessary that they remain in phase with each other. To accomplish this, the phase between the inputs to amplifiers 26 and 36 due to microstrip transmission line must be compensated for by phase shifting the output of amplifier 26 using a corresponding microstrip transmission line 32. In a like manner the output of amplifiers 26 and 36 are shifted by microstrip transmission line 40 to keep them in phase with the output of amplifier 42. The additive combining of the outputs of the amplifiers is continued for as many stages as desired.

This basic distributed amplifier concept has been expanded to a two dimensional distributed amplifier as disclosed by S. G. Haing in his article "2-D Distributed Amp Ups Power, Not Load", *Microwaves & R.F.*, April, 1987, pp. 139-142.

Phase shifters are used to electronically steer an antenna in phased array applications. Millimeter-wave shifters will be required as more systems applications are defined to utilize the advantages of this frequency range. Wide band 180 degree power dividers have wide range applications in microwave monolithic balanced and double balanced mixers, push pull power amplifiers and bi-phase modulators. As a result, a digitally controlled RF phase shifting circuit is desired. In particular, a phase shifting circuit capable of phase shifting an RF signal through a predetermined phase angle or predetermined sets of phase angles.

Disclosed herein is a two dimensional distributed amplifier which is capable of generating output signals phase shifted through predetermined phase angles relative to each other.

SUMMARY OF THE INVENTION

A two dimensional distributed amplifier phase shifter having at least one microstrip transmission line for phase shifting a received RF signal through a predetermined phase angle. A reference amplifier having an input connected to one end of the microstrip transmission line which generates a reference output signal in response to the received RF signal. At least one phase shifted amplifier connected to other end of the microstrip transmission line which generates a phase shifted output signal phase shifted from said reference signal by the phase angle predetermined by the microstrip transmission line. In the preferred embodiment, the two dimensional distributed amplifier is a monolithic microwave integrated circuit (MMIC) formed directly on a semiconductor chip and may include a plurality of phase shifted amplifier circuits to produce a plurality of phase shifted output signals.

One object of the invention is a monolithic millimeter microwave phase shifter circuit compatable with existing integrated circuit technology.

Another object of the invention is a two dimensional distributed amplifier capable of producing at least one phase shifted output.

Another object of the invention is a two dimensional distributed amplifier capable of generating a plurality of phase shifted outputs.

These and other objects of the invention will become more apparent from a reading of the Specification in conjunction with the drawings.

BRIEF DESCRIPTION OF THE DRAWINGS

FIG. 8 is a circuit diagram of a prior art Wilkinson combiner.

FIG. 9 is an alternative embodiment of the Wilkinson combiner shown in FIG. 8.

FIG. 10 is an embodiment of a combiner circuit using solid state switches.

FIG. 11 shows the structural design of a multiple gate solid state switch usable in the embodiment of the combiner of FIG. 10.

DETAILED DESCRIPTION OF THE INVENTION

Figure 2:
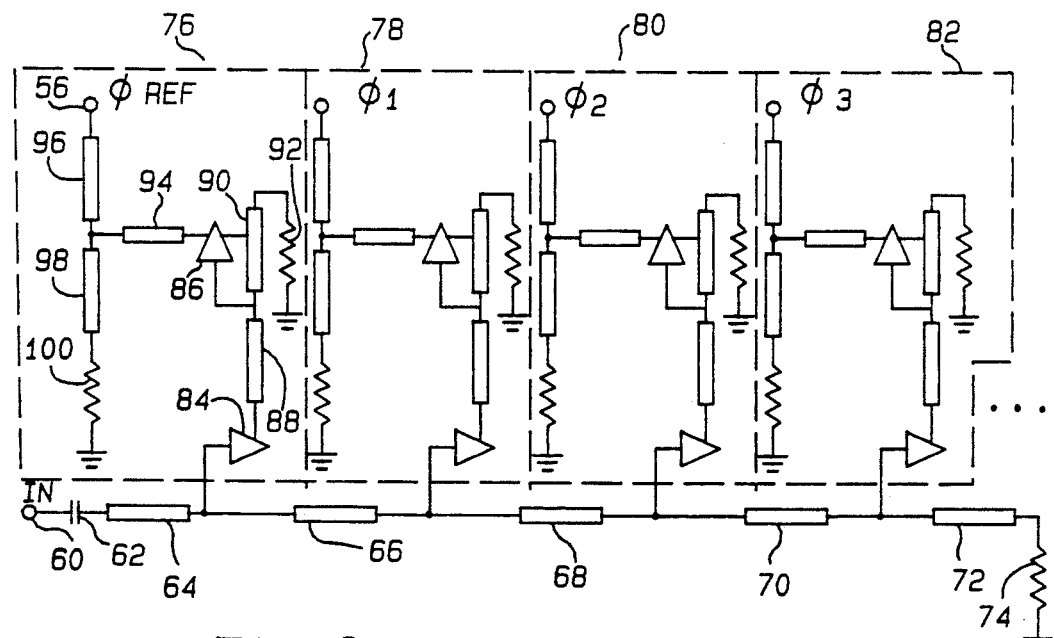
FIG. 2 is a circuit diagram of a two dimensional distributed amplifier having phase shifted outputs.

The details of a two dimensional distributed amplifier having multiple phase shifted outputs are shown in FIG. 2. In the preferred embodiment, the two dimensional distributed amplifier is in the form of a monolithic microwave integrated circuit formed on a semiconductor substrate, and for very high input frequencies on a gallium arsenide (GaAs) substrate.

An RF input signal is receivable at an input terminal 60 and is coupled by a capacitor 62 to a plurality of serially connected microstrip transmission lines 64 through 72. In the preferred embodiment, the microstrip transmission lines lie along a linear path. Each microstrip transmission lines 64 through 72 produces a predetermined phase shift of the received RF signal as taught by M. Fukuta et al in their paper "GaAs Microwave Power FET", *IEEE Transactions on Electron Devices*, Vol ED-23, No. 4, April 1976, pp. 388–394. In this article, M. Fukuta et al defines equations for calculating the phase shift along microstrip transmission lines.

Figure 1:
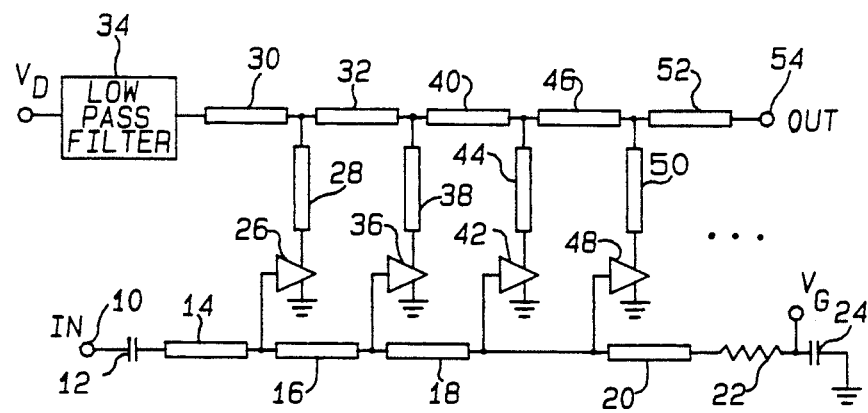
FIG. 1 is a circuit diagram of a distributed amplifier as taught by the prior art.

The terminal resistance 74 symbolically represents a gate voltage source such as illustrated by resistor 22, capacitor 24 and gate voltage terminal $V_g$ shown in FIG. 1. The two dimensional distributed amplifier has a plurality of orthogonally disposed phase amplifier circuits, such as phase amplifier circuits 76–82. Phase amplifier circuit 76 is connected to the junction between microstrip transmission lines 64 and 66 while phase amplifier circuit 78 is connected to the junction between microstrip transmission lines 66 and 68. In a like manner, phase amplifier circuit 80 is connected to the junction between microstrip transmission line 68 and 70 while phase amplifier circuit 82 is connected to the junction between microstrip transmission lines 70 and 72. The number of phase amplifier circuits is not limited to 4 as shown. The number of phase amplifier circuits may vary from 2 to any number required for the particular application.

The phase amplifier circuits 76–82 are substantially the same, therefore only phase amplifier circuit 76 will be discussed in detail.

The phase amplifier circuit 76 has an input FET amplifier 84 whose gate is connected to the junction between microstrip lines 64 and 66 and whose drain is connected to the gate of an output FET amplifier 86 by a microstrip transmission line 88. The gate of FET amplifier 86 is also connected to a source of gate voltage, symbolized by resistance 92, through a microstrip transmission line 90. The drain of FET amplifier 86 is connected to an output terminal 56 by serially connected microstrip transmission lines 94 and 96 and is connected to a drain voltage source, symbolized by resistance 100, by means of microstrip transmission lines 94 and 98. The output signal generated at output terminal 56 of the phase amplifier 76 is a phase reference signal designated $\phi_{REF}$. The output signal generated at output terminals of phase amplifiers 78, 80, and 82 are phase shifted signals $\phi_1$, $\phi_2$, and $\phi_3$ respectively. For example, the microstrip transmission lines 66, 68 and 70 may produce a 60° phase shift of the received RF signal between each of the phase shift amplifier circuits. Therefore, the output signal $\phi_1$ of phase amplifier circuit 78 is phase shifted 60° from the reference output signal $\phi_{REF}$. In a like manner the output signals $\phi_2$ and $\phi_3$ of phase amplifier circuit 80 and 82 respectively are phase shifted 120° and 180° from the reference output signal $\phi_{REF}$. The amount that the RF signal is phase shifted by each microstrip transmission line can be varied as required for the particular application.

Figure 3:
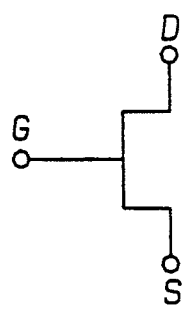
FIG. 3 is a circuit symbol of a field effect transistor.
Figure 4:
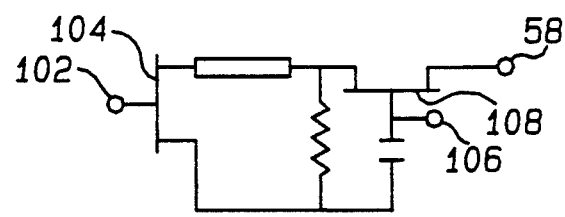
FIG. 4 is a cascade FET amplifier circuit.

The FET amplifiers 84 and 86 may be a single FET as shown in FIG. 3 or may be a cascade FET amplifier such as shown in FIG. 4 in which the terminal 102 connected to the gate of FET 104 is the input to the gated FET amplifier, the terminal 106 connected to the gate of FET 108 is a gate control terminal and terminal 58 connected to the drain of FET 108 is the output terminal. This type of cascade FET amplifier can be turned "on" or "off" in response to an external signal applied to gate control terminal 106. In this manner, the output terminal 56 in each phase amplifier circuits 76–82 may be connected to a Wilkinson Power Combiner 110 as shown in FIGS. 8 and 9. The Wilkinson Power Combiner 110 shown in FIG. 8 has three similar electrical networks 280, 282 and 284. Electrical network 280 combines the signals $\phi_{REF}$ and $\phi_1$, generated by the signal amplifiers 76 and 78, respectively (FIG. 2) at a junction 286. In a similar manner, electrical network 282 combines the signals $\phi_2$ and $\phi_3$ generated by the signal amplifiers 80 and 82 at a junction 288. The output signals of electrical networks 280 and 282 are combined at the output 290 of the electrical network 284. In this arrangement, only the cascade FET amplifier in the phase amplifier circuit generating a RF signal at the desired phase angle will be turned on, while the others will be turned off.

As shown in FIG. 9, additional microstrip transmission lines, such as microstrip transmission lines 112 and 114 may be added to any branch of the Wilkinson Power Combiner 110 to correct the phase relationship between the reference signal $\phi_{REF}$ and the output of the phase amplifier circuit to which it is connected. In the embodiment shown in FIG. 9, the Wilkinson Power Combiner 110 has a first electrical network 292 combining the signals $\phi_{REF}$ and $\phi_1$ at an output junction 294. A second electrical network 296 combines the output of the first electrical network 292 with the signal $\phi_2$ at an output junction 298 through a microstrip line 112. A third electrical network 300 combines the output of the second electrical network 296 with the signal $\phi_3$ at an output terminal 302 through a microstrip line 114.

Alternatively, a solid state switch circuit as shown in FIG. 10 can be used to select the desired phase shifted output signal. In the embodiment of the combiner shown in FIG. 10, has three solid state switches 304, 306 and 308. Switch 304 connects, in the alternative, the signals $\phi_{REF}$ and $\phi_1$, to a first input terminal 310 while the second switch 306 connects, in the alternative, the signals $\phi_2$ or $\phi_3$ to a second input terminal 312 of switch 308. Switch 308 connects, in the alternative, the signal at the first input terminal 310 or the second input terminal 312 to an output terminal 314. The signals $\phi_{REF}$, $\phi_1$, $\phi_2$ and $\phi_3$ are the output signals of signal amplifiers 76, 78, 80 and 82 shown in FIG. 2. The solid state switches may be in the form of a multiple gate FET 116 as shown in FIG. 11. The multiple gate FET 116 has a common drain 118 and a common source 120. A pair of electrically isolated signal gates 122 and 124 extend approximately half way through the gate region 130 between the drain 118 and source 120. In a like manner, a pair of control gates 126 and 128 are also disposed in the gate region 130. The control gates 126 and 128 can be controlled by an external source to permit one or the other RF signals of signal gates 122 or 124 to be amplified by the multiple gate FET 116.

Figure 5:
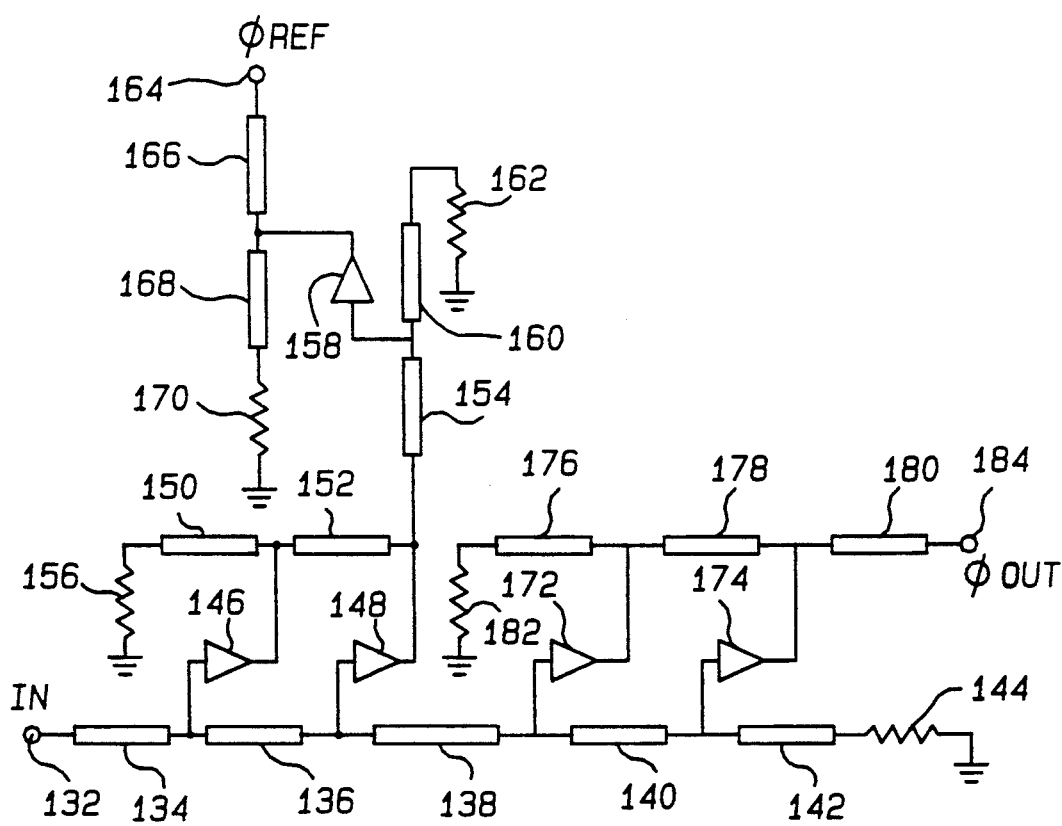
FIG. 5 is a circuit diagram of a two dimensional 180 degree distributed amplifier.

FIG. 5 shows an alternate embodiment of the two dimensional distributed amplifier having a biphase output phase shifted by 180° from each other. In this embodiment, an input signal is received at an input terminal 132 which is coupled to a plurality of serially connected microstrip transmission lines 134–142. The serially connected transmission lines 134–142 is terminated by a gate voltage source, symbolized by resistance 144, as in the preceeding embodiment.

The RF signals at the junctions between microstrip transmission lines 134 and 136 and 136 and 138 are connected to the inputs of FET amplifiers 146 and 148 respectively. The output of FET amplifiers 146 is connected to the junction of microstrip transmission line 150 and 152 while the output of FET amplifier 148 is connected to the junction between microstrip transmission lines 152 and 154. A gate voltage source, such as shown in FIG. 1 is symbolized by resistance 156 connected to one end of microstrip transmission line 150. A reference signal output FET amplifier 158 has its input connected to the junction between microstrip transmission lines 154 and 160 and its output connected to the reference signal, $\phi_{REF}$, output terminal 164. A resistance 162 connects the other end of serially connected microstrip transmission lines 150, 152, 154 and 160 to ground.

The output of FET amplifier 158 is connected to a drain voltage source, symbolized by resistance 170 through a microstrip transmission line 168 and to an output terminal 164 through microstrip transmission line 166. The phase shifts of the RF signal caused by microstrip transmission lines 136 and 152 are equal so that the output signal generated by FET amplifier 146 will be in phase with the output of FET transistor 148.

The junction between microstrip transmission lines 138 and 140 is connected to the input of FET amplifier 172 while the junction between microstrip transmission lines 140 and 142 is connected to the input to FET amplifier 174. Serially connected microstrip transmission lines 176, 178, and 180 have one end connected to a drain voltage source, symbolized by resistance 182 and the other end connected to output terminal $\phi_{OUT}$ 184. The output of FET amplifier 172 is connected to the junction between microstrip transmission lines 176 and 178 and the output of FET amplifier 174 is connected to the junction between microstrip transmission lines 178 and 180.

The microstrip transmission lines 138 and 140 are selected to phase shift the RF signal through a predetermined angle relative to the output signal $\phi_{REF}$. Further, the microstrip transmission lines 140 and 178 produce the same phase shift so that the outputs of FET amplifiers 172 and 174 will additively combine to produce the output signal $\phi_{OUT}$. The microstrip transmission lines 138 and 140 may be selected to produce a 180° phase shift relative to the reference signal $\phi_{REF}$ or any other desired phase shift angle. For a balanced mixer or push pull amplifier, the output signals $\phi_{REF}$ and $\phi_{OUT}$ phase shifted 180° from each other could be used to drive the follow on circuits directly.

Figure 6:
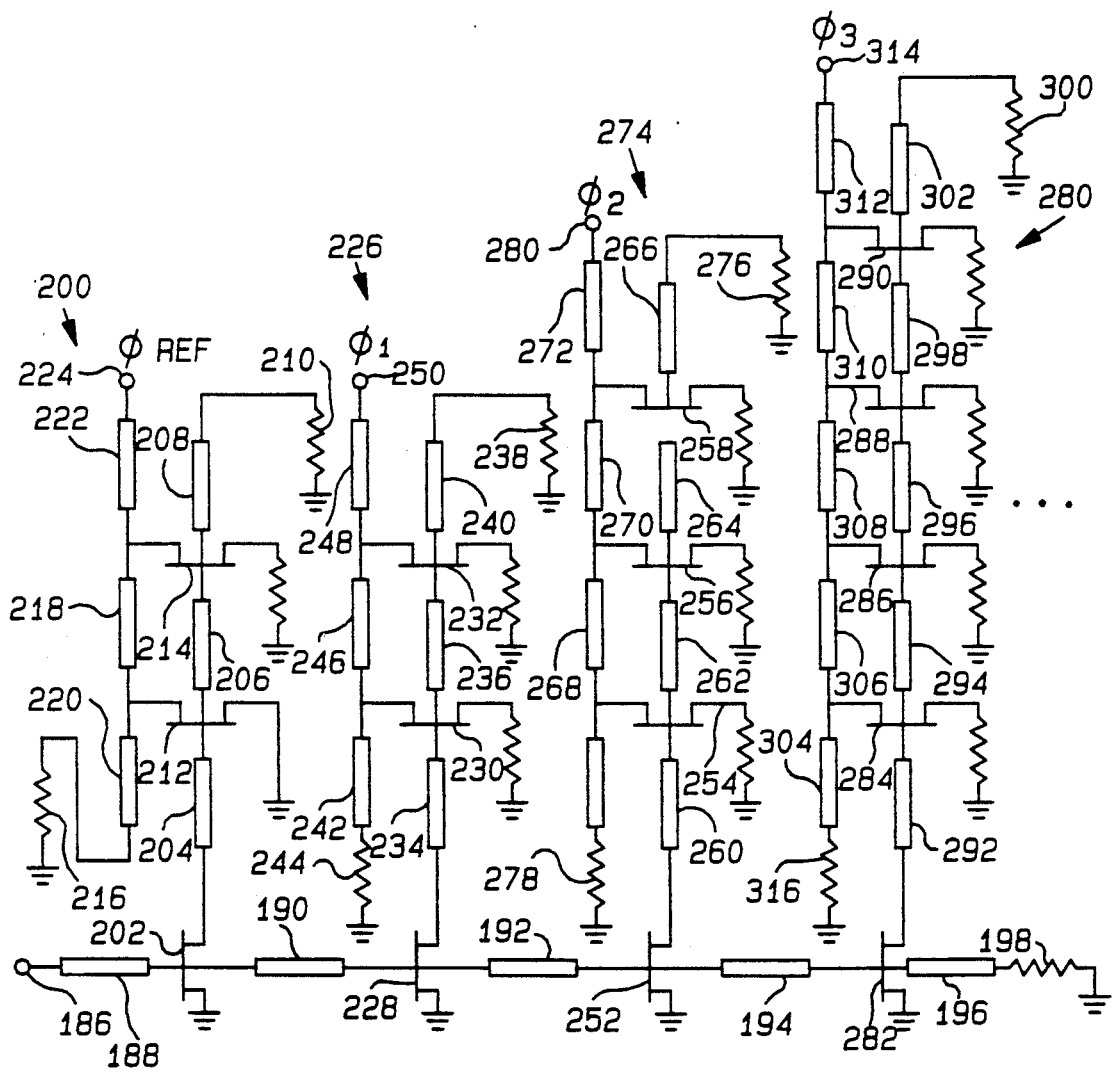
FIG. 6 is a circuit diagram of a two dimensional distributed amplifier phase shifter for millimeter applications.
Figure 7:
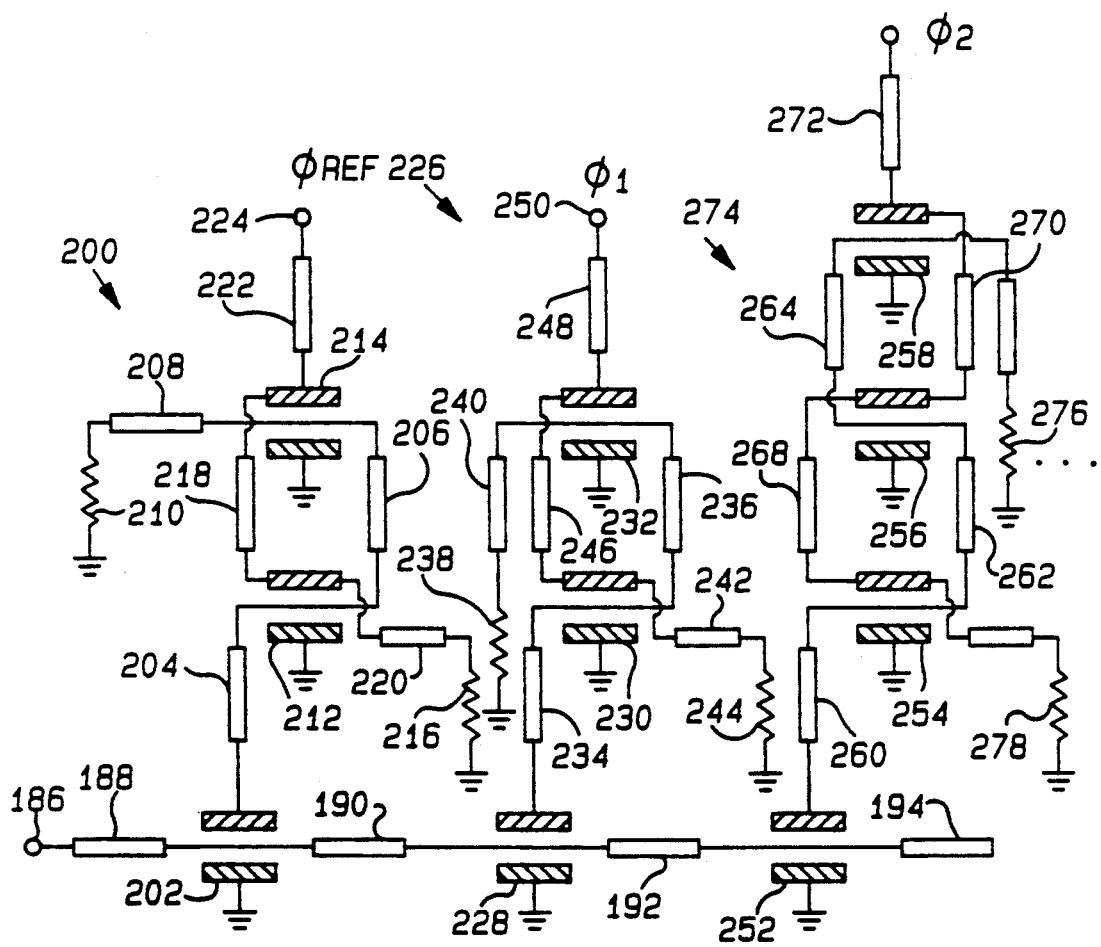
FIG. 7 resembles a physical layout of a portion of the circuit shown in FIG. 6.

For higher frequency, millimeter wave two dimensional phase shifters, a modified technique can be used as shown in FIGS. 6 and 7. As the frequency increases, the FET gate itself may act as inductor in series with the FET shunt, $C_{GS}$ and $C_{DS}$ capacitances. In this circuit the induction of the gate itself is used to create the equivalent microstrip transmission line. M. Fukuta et al defines equations for calculating the phase shift along the gate. FIG. 6 is a schematic of such a two dimensional phase shifter circuit while FIG. 7 shows physical layout of the circuit. Referring to FIG. 6, an RF signal input terminal 186 is connected a plurality of serially connected microstrip transmission lines 188 through 196 and to a gate voltage source symbolized by resistance 198. The gate of a first FET 202 of a reference amplifier circuit 200 is connected to the junction between microstrip transmission lines 188 and 190. The source of FET 202 is connected to ground while the drain is connected to a gate voltage source, symbolized by resistance 210 through serially connected microstrip transmission lines 204, 206 and 208. Output FET's 212 and 214 have their gates connected to the junctions between microstrip transmission lines 204 and 206 and 206 and 208 respectively. The sources of FET's 212 and 214 are connected to ground while their drains are connected to a drain voltage source, symbolized by resistance 216 through microstrip transmission lines 218 and 220 as shown. The drains are also connected to an output terminal 224 by microstrip transmission line 222. The microstrip transmission lines along with the inductance of the gates are selected as taught by Fukuta et al so that the RF signal generated by FET 212 is in phase with the RF signal generated by FET 214 so that the combine to produce the reference signal $\phi_{REF}$ at output terminal 224.

A first phase shifted amplifier circuit 226 has a first FET 228 whose gate is connected to the junction between microstrip transmission lines 190 and 192.

The gates of FET's 230 and 232 are connected to the drain of FET 228 via serially connected microstrip transmission lines 234 and 236 as shown and to a gate voltage source symbolized by resistance 238 through a microstrip transmission line 240. The drains of FET's 230 and 232 are connected to a drain voltage source, symbolized by resistance 244 through microstrip transmission lines 242 and 246 and to an output terminal 250 by microstrip transmission line 248. FET's 228, 230, and 232 in combination with microstrip transmission lines 234, 236, 240, 242 and 246 produce a phase shifted signal $\phi_1$ at the output terminal 250.

In a like manner, FET's 252 through 258 in combination with microstrip transmission lines 260 through 272 of a second phase shifted amplifier circuit 274 generates a second phase shifted signal $\phi_2$ at output terminal 279. Resistances 276 and 278 symbolize gate and drain voltage sources respectively. In this circuit microstrip transmission lines 260-272 and the gate inductance of transistors 254-258 are selected so that the signals generated by the drains of the three transistors 254, 256 and 258 are in phase and additively combine to generate the output signal $\phi_2$.

The two dimension distributed amplifier circuit may include a third phase shifted amplifier circuit 280 as shown. The third phase shifted amplifier circuit 280 has five FET's 282 through 290. The gates of FET's 284 through 290 are connected to the drain of FET 282 by means of interleaved microstrip transmission lines 292 through 298. The gates of FET's 284 through 290 are also connected to a gate voltage source, symbolized by resistance 300 through a microstrip transmission line 302. The gate a FET 282 is connected to the junction between microstrip transmission lines 194 and 196. The drains of FET's 284 through 290 are connected to a drain voltage source 316 by microstrip transmission lines 304 through 310 and to an output terminal 314 through a microstrip transmission line 312. The physical dimensions of the microstrip transmission lines 292 through 298 and 306 through 310 are selected so that the outputs of FET's 284 through 290 are in phase with each other so that they additively combine to form an output signal $\phi_3$. As in previous embodiments, the two dimensional distributed amplifier circuit of FIG. 6 may include additional phase shifted amplifier circuits as required.

FIG. 7 shows a physical layout of the two dimensional distributed amplifier shown in FIG. 6. The third phase shifted amplifier 280 of FIG. 6 is omitted in FIG. 7 to simplify the drawing. In FIG. 7, the same numerals are used for the same elements shown in FIG. 6. As shown in FIG. 7, the microstrip transmission lines 188, 190, 192 and 194 are connected in series with the gates of FET's 202, 228 and 252.

In a like manner, the microstrip transmission lines 204, 206 and 208 are connected in series with the gates of FET's 212 and 214 of the reference amplifier circuit 200, microstrip transmission lines 234, 236 and 240 are connected in series with the gates of FET's 230 and 232 in the first phase shifted amplifier circuit 226 and microstrip transmission lines 260 and 262, 264 and 270 are connected in series with the gates of FET's 254, 256 and 258 of the second phase shifted amplifier circuit 274. The circuit arrangement of FIG. 7 clearly shows how the the gates of the FET's may be used as microstrip transmission lines which contribute to the phase shifting of the received RF signal.

It is not intended that the invention be limited to the circuits illustrated in the drawings and discussed in the specification. It is recognized that those skilled in the art will be able to conceive alternate embodiments within the spirit of the invention as set forth in the appended claims.

What is claimed is:

1. A two dimensional distributed amplifier phase shifter comprising:
   a semiconductor substrate;
   at least one microstrip transmission line disposed on a surface of said semiconductor substrate, said at least one microstrip transmission line phase shifting a received RF signal through a predetermined phase angle;
   a reference amplifier circuit disposed on said surface of said semiconductor substrate orthogonal to said at least one microstrip transmission line, said reference amplifier having an input connected to one end of said at least one microstrip transmission line and generating a reference signal in response to a received RF signal;
   at least one phase shifted amplifier circuit disposed on said surface of said semi-conductor substrate orthogonal to said at least one microstrip transmission line, said phase shifted amplifier circuit having an input connected to an opposite end of said microstrip transmission line and generating a phase shifted signal in response to a received RF signal phase shifted by said at least one microstrip transmission line, said phase shifted signal being phase shifted by 180° with respect to said reference signal.

2. The phase shifter of claim 1 wherein said reference amplifier circuit comprises:
   an input amplifier having its input connected to said one end of said microstrip transmission line and an output; and
   at least one output amplifier having an input connected to said output of said input amplifier, and an output, said output amplifier generating said reference signal at said output.

3. The phase shifter of claim 2 wherein said input amplifier circuit comprises at least two input amplifiers connected in parallel with each other and means for phase shifting the output of each of said at least two output amplifiers so that the output signals generated by said at least two output amplifiers are in phase with each other and additively combine.

4. The phase shifter of claim 3 wherein said means for phase shifting comprises:
   a first microstrip transmission line connecting an input of said first input amplifier with an input of said second input amplifier; and
   a second microstrip transmission line connecting an output of said first input amplifier with an output of said second input amplifier, said first and second microstrip transmission lines producing substantially identical phase shifts of said RF signal.

5. The phase shifter of claim 4 wherein said at least one phase shifted amplifier circuit comprises at least two output amplifiers connected in parallel with each other and means for phase shifting the output of each of said at least two output amplifiers so that all of said at least two output amplifiers are in phase with each other and their outputs additively combine.

6. The phase shifter of claim 2 wherein said input and output amplifiers are field effect transistors.

7. The phase shifter of claim 2 wherein at least one of said input and output amplifiers is responsive to a control signal received from an external source to switch between a conductive and nonconductive state.

8. The phase shifter of claim 7 wherein said at least one microstrip transmission line comprises a plurality of serially connected microstrip transmission lines disposed along a line, and wherein said at least one phase shifted amplifier circuit comprises a plurality of phase shifted amplifier circuits disposed othogonal to said line, each phase shifted amplifier circuit having an input connected to an end of a respective one of said plurality of microstrip transmission lines.

9. The phase shifter of claim 8 wherein each of said phase shifted amplifier circuits comprises:
   an input amplifier having an input connected to said end of said respective one microstrip transmission line and an output, and;
   at least one output amplifier having an input connected to said output of said input amplifier and an output, said at least one output amplifier generating said phase shifted signal at said output.

10. The phase shifter of claim 9 wherein said input and output amplifiers are field effect transistors formed on said substrate.

11. The phase shifter of claim 10 wherein each of said input amplifier field effect transistor has a gate, said gate being connected in series between said end of said microstrip transmission line and an adjacent microstrip transmission line of said serially connected microstrip transmission lines.

12. The phase shifter of claim 11 wherein said RF signal has a wavelength in the millimeter wave length range, the inductance of said gates of said input amplifier field effect transistors is combined with the inductance of said microstrip transmission lines to produce said predetermined phase shift.

13. The phase shifter of claim 9 wherein at least one of said input and output amplifiers comprises:
   a first field effect transistor having a gate serving as said input, a source, and a drain; and
   a second field effect transistor having a source connected to said drain of said first field effect transistor, a drain serving as said output, and gate responsive to an external signal to switch said second field effect transistor between a conductive and a nonconductive state.

14. The phase shifter of claim 13 further including a combiner means for combining said reference signal and phase shifted signals generated by said plurality of phase shifted amplifier circuits in at a unitary output.

15. The phase shifter of claim 8 wherein said phase shifter has a unitary output, said phase shifter further including solid state switch means for selectively conducting a selected one of said reference signal and said plurality of phase shifted signals to said unitary output.

16. The phase shifter of claim 2 wherein at least one of said input and output amplifiers comprises:
 a first field effect transistor having a gate serving as said input to said amplifier, a source and a drain; and
 a second field effect transistor having a source connected to said drain of said first field effect transistor, a drain serving as said output and a gate responsive to an external signal to switch said second field effect transistor between a conductive and nonconductive state.

17. The phase shifter of claim 1 wherein said semiconductor substrate is gallium arsenide substrate and said field effect transistors are gallium arsenide field effect transistors.

18. A two dimensional distributed amplifier for generating phase shifted signals comprising:
 at least two serially connected microstrip transmission lines, each of said serially connected microstrip transmission lines phase shifting an RF signal received at one end of said at least two microstrip transmission lines,
 reference amplifier means having an input connected to said one end of said at least two serially connected microstrip transmission lines, said reference amplifier circuit generating a reference signal;
 first phase amplifier means having an input connected to the junction between said at least two microstrip transmission lines, said first phase amplifier means generating a first phase signal phase shifted from said reference signal by a first predetermined phase angle; and
 second phase amplifier means having an input connected to an opposite end of said at least two serially connected microstrip transmission lines, said second phase amplifier means generating a second phase signal phase shifted from said reference signal by a second predetermined phase angle said second predetermined phase angle being a multiple of the phase angle of said first predetermined phase angle.

19. The two dimensional distributed amplifier of claim 18 wherein said at least two serially connected microstrip transmission lines are a plurality of microstrip transmission lines and said second phase amplifier means comprises a plurality of phase amplifier circuits, each phase amplifier circuit of said plurality of phase amplifier circuits being connected to an end of a respective one of said plurality of microstrip transmission lines, each of said phase amplifier circuits generating an output signal phase shifted with respect to said reference signal by a phase angle which is a multiple of said first predetermined phase angle.

20. A two dimensional distributed amplifier phase shifter comprising:
 a semiconductor substrate;
 at least two serially connected microstrip transmission lines disposed on a surface of said semiconductor substrate, each of said at least two microstrip transmission lines phase shifting a received RF signal through an equal predetermined phase angle;
 a reference amplifier circuit disposed on the surface of said semiconductor substrate having an input connected to one end of said at least two serially connected microstrip transmission lines, said reference amplifier generating a reference signal in response to a received RF signal;
 a first phase shifted amplifier disposed on t he surface of said semiconductor substrate having an input connected to a first junction of said at least two serially connected microstrip transmission lines, said first phase shifted amplifier generating a first output signal phase shifted from said reference signal by a phase angle equal to said predetermined phase angle; and
 second phase shifted amplifier means disposed on said semiconductor substrate and connected to the end of said at least two serially connected microstrip transmission lines opposite said one end, said second phase shifted amplifier means generating at least a second output signal phase shifted from said reference signal by a phase angle equal to the sum of said equal predetermined phase angles produced by said at least two serially connected microstrip transmission lines.

21. The phase shifter of claim 20 wherein said at least two microstrip transmission lines comprise a plurality of microstrip transmission lines and wherein said second phase shifted amplifier means comprises a plurality of phase shifted amplifier circuits, each phase shifted amplifier circuit of said plurality of phase shifted amplifier circuits being connected to an end of a respective one of said plurality of microstrip transmission lines, each of said phase shifted amplifier circuits generating an output signal phase shifted with respect to said reference signal in an ascending multiple of said predetermined phase angle, said ascending multiple being a number equal to the number of microstrip transmission lines between said phased shifted amplifier circuit and said first phase shifted amplifier.

* * * * *